(12) United States Patent
Nakada et al.

(10) Patent No.: US 8,945,965 B2
(45) Date of Patent: Feb. 3, 2015

(54) METHOD FOR PRODUCING A GROUP III NITRIDE SEMICONDUCTOR LIGHT-EMITTING DEVICE

(75) Inventors: Naoyuki Nakada, Kiyosu (JP); Yasuhisa Ushida, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 44 days.

(21) Appl. No.: 13/525,110

(22) Filed: Jun. 15, 2012

(65) Prior Publication Data
US 2012/0322189 A1    Dec. 20, 2012

(30) Foreign Application Priority Data

Jun. 20, 2011  (JP) ................. 2011-136197

(51) Int. Cl.
*H01L 21/00* (2006.01)
*H01L 33/00* (2010.01)
*H01L 33/14* (2010.01)

(52) U.S. Cl.
CPC ............... *H01L 33/007* (2013.01); *H01L 33/14* (2013.01)
USPC .... 438/46; 438/47; 257/E33.03; 257/E33.029

(58) Field of Classification Search
CPC ................. H01L 33/14; H01L 33/02
USPC ................. 257/76, 103, E33.001, E33.025, 257/E33.028, E33.033, E33.034, E51.01, 257/E31.021, E33.029, E33.03, 101, 102; 438/46, 47, 681, 71, 569
See application file for complete search history.

(56) References Cited

U.S. PATENT DOCUMENTS

| | | | |
|---|---|---|---|
| 5,903,017 A * | 5/1999 | Itaya et al. | 257/190 |
| 8,513,694 B2 | 8/2013 | Fukushima et al. | |
| 2002/0056846 A1 * | 5/2002 | Tsuda et al. | 257/86 |
| 2003/0026309 A1 * | 2/2003 | Matumoto | 372/46 |
| 2004/0183090 A1 * | 9/2004 | Kitaoka et al. | 257/103 |
| 2004/0262624 A1 * | 12/2004 | Akita et al. | 257/90 |

(Continued)

FOREIGN PATENT DOCUMENTS

| | | |
|---|---|---|
| CN | 101355129 A | 1/2009 |
| JP | 2003-101149 | 4/2003 |

(Continued)

OTHER PUBLICATIONS

Takahashi et al "Wide bandgap semiconductor optical and electronic devices", Japan , Morikita Shuppan Co, Ltd, Mar. 31, 2006, pp. 100-101.*

(Continued)

*Primary Examiner* — Caridad Everhart
(74) *Attorney, Agent, or Firm* — McGinn IP Law Group, PLLC

(57) ABSTRACT

The present invention provides a Group III nitride semiconductor light-emitting device exhibiting improved light extraction performance. In the production method, a p cladding layer of p-AlGaN is formed by the MOCVD method on a light-emitting layer at a pressure of 30 kPa and with an Mg concentration of $1.5\times10^{20}/cm^3$. A plurality of regions with a nitrogen polarity is formed in the crystals with a Group III element polarity, and thus the p cladding layer has a hexagonal columnar concave and convex configuration on the surface thereof. Subsequently, a p contact layer of GaN is formed by the MOCVD method, in a film along the concave and convex configuration on the p cladding layer.

13 Claims, 3 Drawing Sheets

(56) References Cited

U.S. PATENT DOCUMENTS

| | | | |
|---|---|---|---|
| 2005/0145859 A1* | 7/2005 | Okuyama et al. | 257/81 |
| 2006/0261353 A1* | 11/2006 | Bandoh | 257/79 |
| 2007/0148803 A1* | 6/2007 | Yakushiji et al. | 438/33 |
| 2008/0002748 A1* | 1/2008 | Masui et al. | 372/45.01 |
| 2009/0039373 A1 | 2/2009 | Saito et al. | |
| 2010/0059781 A1 | 3/2010 | Yokobayashi et al. | |
| 2011/0198567 A1* | 8/2011 | Shinohara et al. | 257/13 |
| 2011/0281381 A1* | 11/2011 | Uemura et al. | 438/29 |
| 2011/0309400 A1* | 12/2011 | Fukushima et al. | 257/98 |

FOREIGN PATENT DOCUMENTS

| | | | | |
|---|---|---|---|---|
| JP | 2009-049395 A | 3/2009 | | |
| JP | 2010-062493 A | 3/2010 | | |
| JP | 2010-205988 A | 9/2010 | | |
| JP | 2010205988 | * 9/2010 | | H01L 21/205 |
| JP | 2010-272593 A | 12/2010 | | |

OTHER PUBLICATIONS

Japanese Office Action dated Dec. 24, 2013, with partial English translation.

Kiyoshi Takahashi, et al., "Wide bandgap semiconductor optical and electronic devices", Japan, Morikita Shuppan Co. Ltd., Mar. 31, 2006, 1st edition, 1st printing, pp. 100-101.

Chinese Office Action dated Jun. 30, 2014 with an English translation.

* cited by examiner

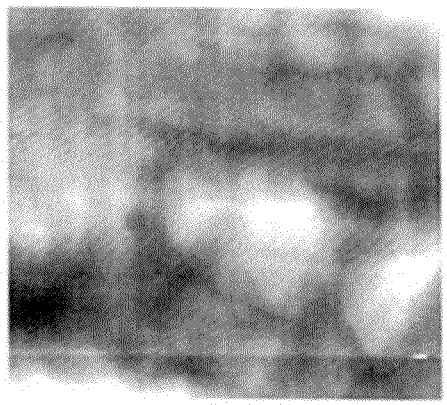
FIG. 3A  $0.9 \times 10^{20}/cm^3$
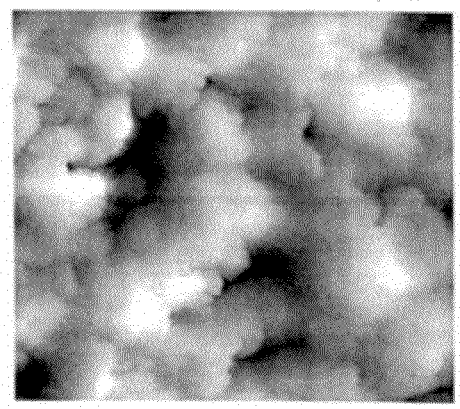
FIG. 3B  $1.2 \times 10^{20}/cm^3$
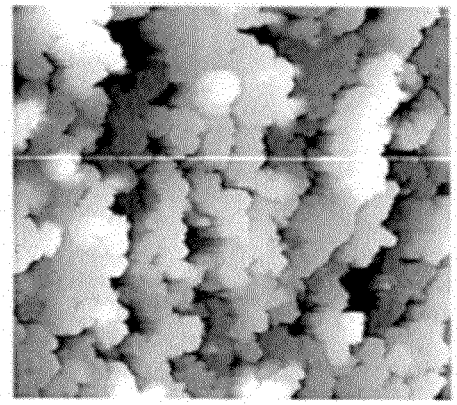
FIG. 3C  $1.5 \times 10^{20}/cm^3$
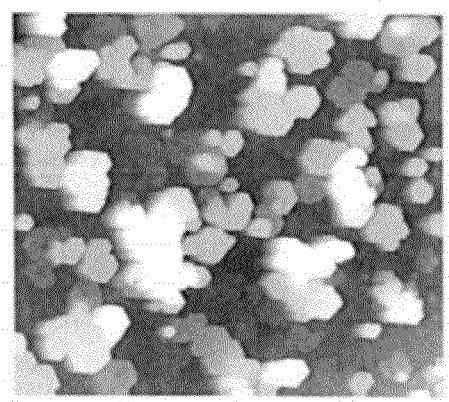
FIG. 3D  $1.8 \times 10^{20}/cm^3$
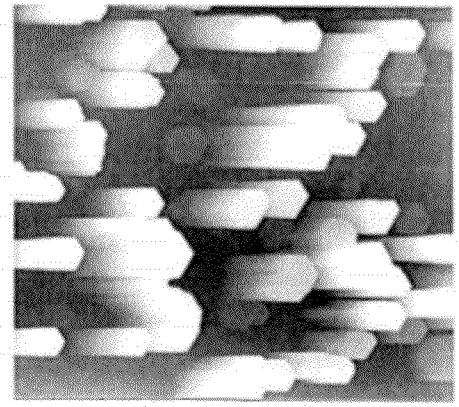
FIG. 3E  $2.1 \times 10^{20}/cm^3$
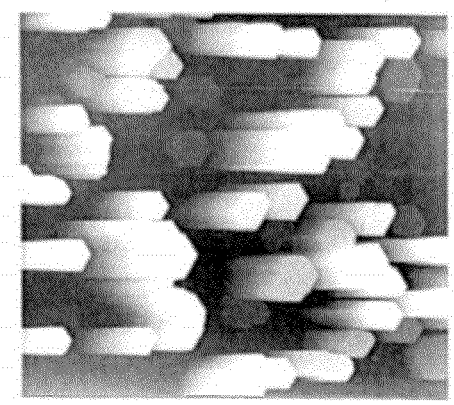
FIG. 3F  $2.4 \times 10^{20}/cm^3$

METHOD FOR PRODUCING A GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device exhibiting improved light extraction performance.

2. Background Art

A method for providing a concave and convex configuration on a light output surface has been proposed to improve the light extraction performance of the Group III nitride semiconductor light-emitting device.

In a known method for providing a concave and convex configuration, a reversed polarity layer is used. A Group III nitride semiconductor is usually grown in a +c axis direction and thus has a Group III element polarity. However, a reversed polarity layer includes at least a portion thereof with a nitrogen polarity opposite to a Group III element polarity. The reversed polarity layer can be formed by doping a high concentration of Mg into the crystal. (For example, refer to Japanese Patent Application Laid-Open (kokai) No. 2003-101149.)

Japanese Patent Application Laid-Open (kokai) No. 2009-49395 discloses that a p-GaN layer is formed on a p cladding layer, a reversed polarity layer is formed on the p-GaN layer, and a concave and convex configuration is formed by wet etching the reversed polarity layer, that is, an area with a nitrogen polarity.

In Japanese Patent Application Laid-Open (kokai) No. 2010-62493, a reversed polarity layer is formed on a p-type first semiconductor layer comprising a Group III nitride semiconductor with a Group III element polarity. On the reversed polarity layer, a p-type second semiconductor layer comprising a Group III nitride semiconductor with a nitrogen polarity is formed, and a concave and convex configuration is formed by wet etching the surface of the second semiconductor layer. It is also disclosed that the first semiconductor layer with a Group III element polarity functions as an etching stopper to prevent the second semiconductor layer from being excessively etched.

Other known methods include a method for providing a concave and convex configuration through processing or a method utilizing steps formed by the step growth on a substrate having a large off-angle.

However, the methods disclosed in Japanese Patent Application Laid-Open (kokai) Nos. 2009-49395 and 2010-62493 require at least a process for forming a reversed polarity layer and a process for wet etching. Therefore, the production is complicated due to multiple processes, resulting in an increase of the production cost.

A method for providing a concave and convex configuration through processing requires a specific process after crystal growth, resulting in an increase of the production cost. In addition, some crystal damage remains and a special etching is required because the Group III nitride semiconductor has high hardness. A p-contact layer being the top surface needs to be thick for processing. However, a p-type Group III nitride semiconductor is difficult to be grown thick while maintaining a good crystallinity.

In a method utilizing the step growth, a concave and convex configuration is formed on all layers being deposited on a substrate. This may reduce the steepness of the interface and degrade the light emission performance. When the off-angle of the substrate is increased, there is a problem that crystallinity is considerably reduced.

SUMMARY OF THE INVENTION

In view of the foregoing, an object of the present invention is to easily form a concave and convex configuration on a light output surface of a Group III nitride semiconductor light-emitting device.

In a first aspect of the present invention, there is provided a method for producing a Group III nitride semiconductor light-emitting device having a p cladding layer and p contact layer, wherein the p cladding layer is formed so as to have a concave and convex configuration thereon by reversing the polarity in at least a portion of crystals through crystal growth by Mg doping, and the p contact layer is formed along the concave and convex configuration on the p cladding layer.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Generally, Si is used as an n-type impurity, and Mg is used as a p-type impurity. Specific examples of the Group III nitride semiconductor include those containing at least Ga, such as GaN, InGaN, AlGaN, and AlGaInN.

The Group III nitride semiconductor has a Group III element polarity that a surface perpendicular to the c-axis of the crystal is the +c plane and a nitrogen polarity that a surface perpendicular to the c-axis of the crystal is the −c plane. In the present invention, "reversed polarity" refers to a state where an N-polar area is formed in at least a portion (a plurality of micro areas) of the crystals with a Group III element polarity.

Preferably, the p cladding layer has an Mg concentration of $1.2 \times 10^{20}/cm^3$ or more. This is because when the convex density is high and the depth of concave and the height of convex are large, light extraction performance can be further improved. Moreover, the p cladding layer preferably has an Mg concentration of $1 \times 10^{21}/cm^3$ or less. When the Mg concentration is higher, the crystallinity of the p cladding layer is deteriorated. More preferably, the p cladding layer has an Mg concentration of $1.2 \times 10^{20}/cm^3$ to $5 \times 10^{20}/cm^3$. The Mg concentration is determined by obtaining in advance a proportional relationship between the Mg doping amount and the supply amount of Mg raw material gas when the p cladding layer is formed in a flat film instead of a concave and convex configuration and calculating based on the supply amount of Mg raw material gas by the measured proportional relationship.

Preferably, the p cladding layer is grown at a pressure of 1 kPa to 100 kPa. When the pressure falls within this range, a concave and convex configuration can be formed such that the convex density is high and the depth of concave and the height of convex are large, resulting in improvement of light extraction performance. More preferably, the pressure is 5 kPa to 70 kPa.

Any material having a larger band gap than that of the light-emitting layer may be used for the p cladding layer. Preferably, AlGaN is used. Moreover, the p cladding layer may comprise multiple layers as well as a single layer. The p contact layer may comprise multiple layers as well as a single layer.

A second aspect of the present invention is drawn to a specific embodiment of the production method according to the first aspect, wherein the amount of Mg doping in the p cladding layer is $1.2 \times 10^{20}/cm^3$ or more.

A third aspect of the present invention is drawn to a specific embodiment of the production method according to the first or second aspect, wherein the p cladding layer is formed of AlGaN.

A fourth aspect of the present invention is drawn to a specific embodiment of the production method according to any of the first to third aspects, wherein the p cladding layer is grown at a pressure of 1 kPa to 100 kPa.

The present invention can easily form a concave and convex configuration to improve light extraction performance. Therefore, the production cost can be reduced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIGS. 3A, 3B, 3C, 3D, 3E, and 3F are the AFM images (photographs) showing a surface of the p contact layer 16.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
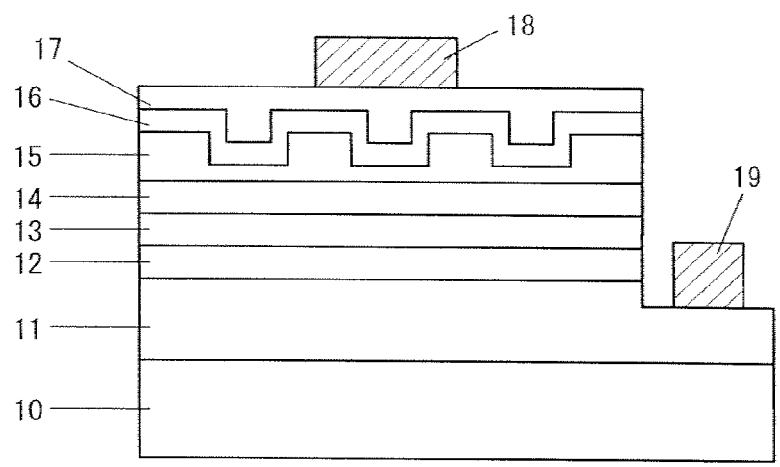
FIG. 1 shows the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device according to Embodiment 1 has a sapphire substrate 10. On the sapphire substrate 10, via an AlN buffer layer (not illustrated), sequentially formed are an n-type contact layer 11 of n-GaN having a thickness of 4 μm, an ESD layer 12 of i-GaN having a thickness of 300 nm and n-GaN having a thickness of 30 nm, an n cladding layer 13 being a multilayer having a thickness of about 64 nm, in which fifteen layer units, each unit being formed of i-InGaN, i-GaN and n-GaN, are deposited, and a light-emitting layer 14 having a MQW structure where an InGaN well layer having a thickness of 3 nm and a GaN barrier layer having a thickness of 4 nm are alternately deposited eight times. On the light-emitting layer 14, sequentially formed are a p cladding layer 15 of p-AlGaN having a thickness of 12 nm and a p contact layer 16 of p-GaN having a thickness of 72 nm. The p contact layer 16 has an Mg concentration of $8\times10^{19}/cm^3$. A trench having a depth extending from the top surface of the p contact layer 16 to the n contact layer 11 is formed in a portion of the top surface of the p contact layer 16. An n-electrode 19 is formed on the surface of the n-contact layer 11 exposed at the bottom of the trench. An ITO transparent electrode 17 is formed in a portion of the surface of the p contact layer 16, which has no trench. A p-electrode 18 is formed on the transparent electrode 17.

As used herein, the thickness of the p cladding layer 15 refers to the thickness when a flat film was formed because crystal growth configuration varies due to the formation of a concave and convex configuration as described later.

The surface of the p cladding layer 15 has a concave and convex configuration in which a plurality of hexagonal columns are observed. The p contact layer 16 is formed in a film along the concave and convex configuration. The surface of the p contact layer 16 has also a concave and convex configuration. The Group III nitride semiconductor light-emitting device according to Embodiment 1 exhibits improved light extraction performance due to the concave and convex configuration.

Next will be described a process for producing the Group III nitride semiconductor light-emitting device according to Embodiment 1.

Figure 2A:
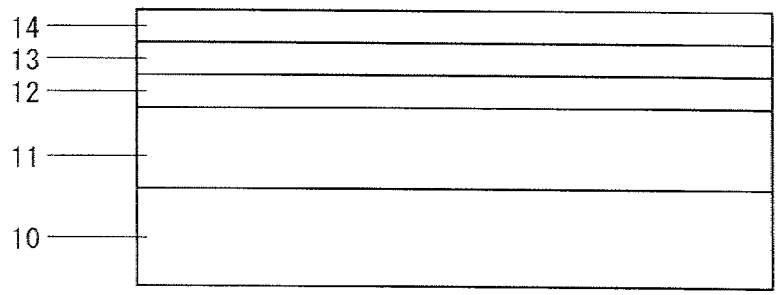
FIGS. 2A, 2B, and 2C show the process for producing the Group III nitride semiconductor light-emitting device according to Embodiment 1.

Firstly, on a sapphire substrate 10 having a c-plane main surface, an AlN buffer layer (not illustrated) is formed by the MOCVD method. An n contact layer 11, an ESD layer 12, an n cladding layer 13, and a light-emitting layer 14 are sequentially formed via the buffer layer (FIG. 2A). The gases employed are as follows: hydrogen or nitrogen ($H_2$ or $N_2$) as a carrier gas; ammonia ($NH_3$) as a nitrogen source; TMG (trimethylgallium) as a Ga source; TMA (trimethylaluminum) as an Al source, TMI (trimethylindium) as an In source; and silane ($SiH_4$) as an n-type dopant gas.

Figure 2B:
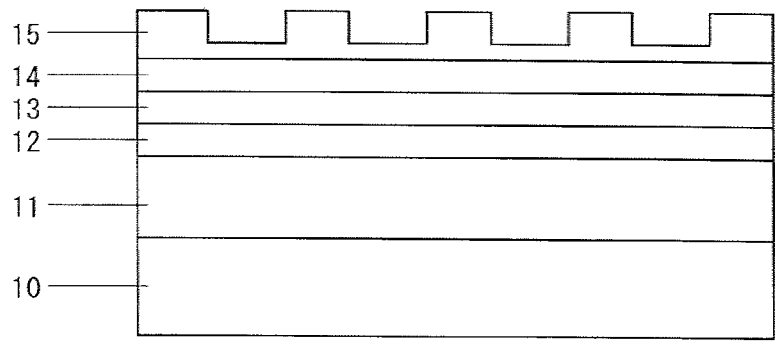

Subsequently, on the light-emitting layer 14, a p cladding layer 15 of p-AlGaN is formed by the MOCVD method at a pressure of 30 kPa and a temperature of 850° C. (FIG. 2B). The Mg concentration is $1.5\times10^{20}/cm^3$. The same carrier gas and raw material gases as mentioned above are employed. Biscyclopentadienylmagnesium ($Mg(C_5H_5)_2$) is used as a p-type dopant gas. Thus, a plurality of nitrogen polar regions is formed in the crystals with a Group III element polarity, and thereby the surface of the p cladding layer 15 has a hexagonal columnar concave and convex configuration. Such a concave and convex configuration is considered to be formed because a reversed polarity layer is formed by excessive Mg doping and Al is readily incorporated into the crystal in low pressure growth.

The pressure does not have to be the above value to form the above concave and convex configuration on the surface of the p cladding layer 15. The pressure is preferably lower than normal pressure. More preferably, the pressure falls within a range of 1 kPa to 100 kPa, and further preferably, 5 kPa to 70 kPa. Moreover, the Mg concentration is preferably $1\times10^{21}/cm^3$ or less. When the Mg concentration is higher than this, crystallinity is deteriorated, which is not desirable. More preferably, the p cladding layer 15 has an Mg concentration of $1\times10^{20}/cm^3$ to $10\times10^{20}/cm^3$, and further preferably, $1.2\times10^{20}/cm^3$ to $5\times10^{20}/cm^3$.

Figure 2C:
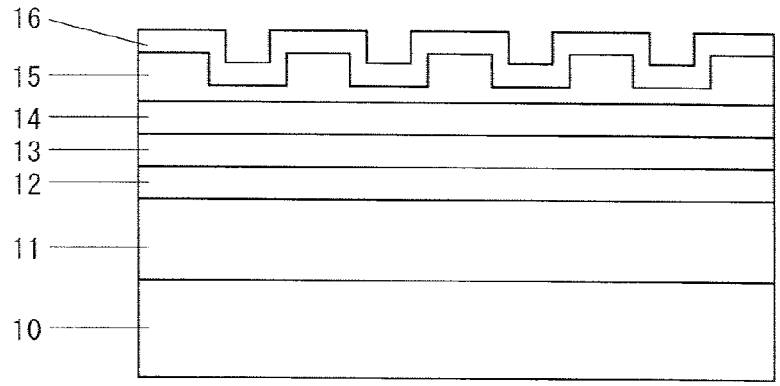

Subsequently, a p contact layer 16 of GaN is formed in a film along the concave and convex configuration by the MOCVD method on the surface of the p cladding layer 15 (FIG. 2C). The pressure is normal and the Mg concentration is $8\times10^{19}/cm^3$. The same carrier gas, raw material gases, and dopant gas as those in forming the p cladding layer 15 are employed. Thus, the p contact layer 16 is formed while retaining the concave and convex configuration of the p cladding layer 15.

Next, a transparent electrode 17 is formed in a portion of the p contact layer 16. A trench having a depth reaching the n contact layer 11 is formed in a portion other than the transparent electrode 17 of the surface of the p contact layer 16. An n electrode 19 is formed at the bottom of the trench, and a p electrode 18 is formed on the transparent electrode 17. Through the above, the Group III nitride semiconductor light-emitting device according to Embodiment 1 as shown in FIG. 1 was produced.

In the Group III nitride semiconductor light-emitting device according to Embodiment 1, a concave and convex configuration is formed to improve light extraction performance using a reversed polarity layer. However, a conventional subsequent process such as wet etching is not required. A concave and convex configuration is formed by changing only the supply amount of Mg raw material gas. Therefore, the production process is simplified so that a concave and convex configuration can be easily formed, and the production cost can be reduced.

FIGS. 3A to 3F are AFM images (photographs) showing a surface of the p contact layer 16. FIG. 3A is of when the p cladding layer 15 has an Mg concentration of $0.9\times10^{20}/cm^3$, FIG. 3B is of $1.2\times10^{20}/cm^3$, FIG. 3C is of $1.5\times10^{20}/cm^3$, FIG. 3D is of $1.8\times10^{20}/cm^3$, FIG. 3E is of $2.1\times10^{20}/cm^3$, and FIG. 3F is of $2.4\times10^{20}/cm^3$. Each of the AFM images shows a range of 20 μm×20 μm. The Mg concentration is determined by obtaining in advance a proportional relationship between the Mg doping amount and the supply amount of Mg raw material gas when the p cladding layer is formed in a flat film and calculating based on the supply amount of Mg raw material gas by the proportional relationship. As is clear from FIG. 3A, when the p cladding layer 15 has an Mg concentration of $0.9\times10^{20}/cm^3$, the surface is flat. However, as the Mg supply amount increases, the surface flatness is deteriorated and the depth of concave and the height of convex are increased as shown in FIGS. 3A to 3F. In FIGS. 3C to 3F, the concave-convex density is higher than that of FIGS. 3A and 3B. It is also found that as the Mg supply amount increases, the hexagonal columnar shape of concave and convex configuration becomes clear. Preferably, the concave-convex density is high and the depth of concave and the height of convex are large to improve light extraction performance. However, as is expected from FIGS. 3A to 3F, the p cladding layer 15 may have an Mg concentration of $1.2\times10^{20}/cm^3$ or more.

Figure 4:
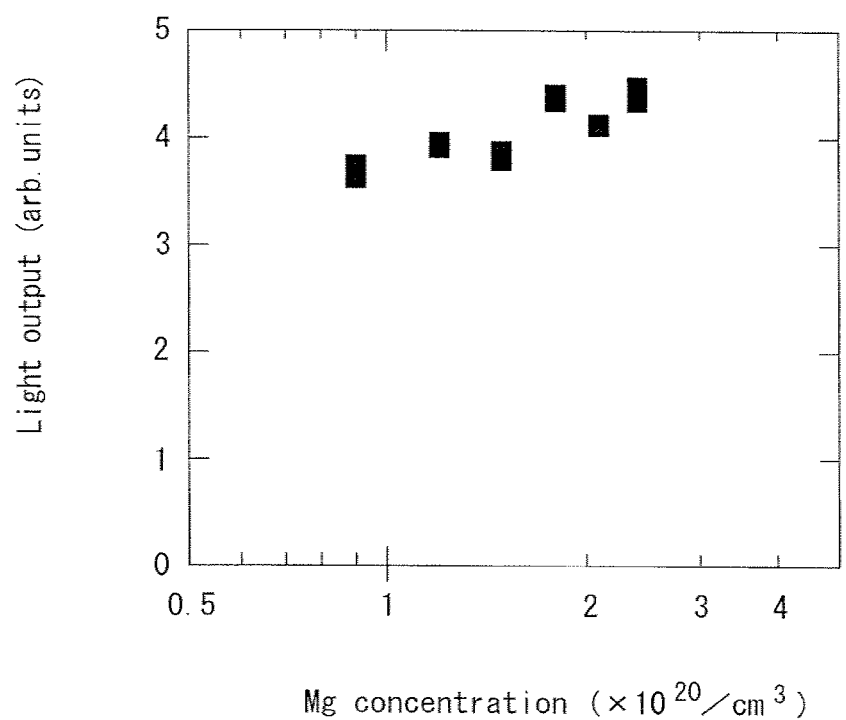
FIG. 4 is a graph showing a relationship between Mg concentration of p cladding layer 15 and light output.

FIG. 4 is a graph showing a relationship between Mg concentration of p cladding layer 15 and light output. The light output propagates in a direction perpendicular to the substrate. As is apparent from FIG. 4, as the Mg concentration increases, the light output is improved. Particularly, when the Mg concentration is $1.8\times10^{20}/cm^3$ or more, the light output can be improved by about 20% compared to when the Mg concentration is $0.9\times10^{20}/cm^3$ (when the surface of the p cladding layer 15 is flat).

Studies have shown no significant change in forward voltage when the Mg concentration of the p cladding layer 15 was changed. As a result, even if the depth of concave and the height of convex are increased by increasing the Mg concentration, the p cladding layer 15 is formed over the entire surface of the light emitting layer 14. Therefore, it is considered that there is no region on the light-emitting layer 14, where the p cladding layer 15 is not formed.

The light-emitting device according to Embodiment 1 uses AlGaN for the p cladding layer 15. However, the present invention is not limited to this. The light-emitting device of the present invention may use any Group III nitride semiconductor having a larger band gap than that of the light-emitting layer 14. Moreover, the p cladding layer 15 may comprise multiple layers instead of a single layer. The p contact layer 16 may comprise multiple layers when it is formed in a film along the concave-convex shape.

A characteristic feature of the present invention is the production method of the p cladding layer 15 and the p contact layer 16. Other layers may be provided with any of known structures and production methods. For example, the n contact layer 11 may comprise multiple layers having different Si concentrations or the p contact layer 16 may comprise multiple layers having different Mg concentrations. Moreover, a SiC, Si, ZnO, spinel, or GaN substrate may be used other than the sapphire substrate 10. A concave and convex configuration such as a stripe pattern or a dot pattern may be formed on the substrate.

The Group III nitride semiconductor light-emitting device produced by the method of the present invention can be employed as an illumination apparatus.

What is claimed is:

1. A method for producing a Group III nitride semiconductor light-emitting device comprising a p cladding layer and a p contact layer, the method comprising:
   forming the p cladding layer so as to have a hexagonal columnar concave and convex configuration thereon by reversing a polarity in at least a portion of crystals through crystal growth by Mg doping; and
   forming the p contact layer along the hexagonal columnar concave and convex configuration on the p cladding layer,
   wherein the p cladding layer is grown at a pressure of 5 kPa to 70 kPa,
   wherein an amount of Mg doping in the p cladding layer is in a range from $1.8\times10^{20}/cm^3$ to $10\times10^{20}/cm^3$, and
   wherein the p contact layer comprises a hexagonal columnar concave and convex configuration on the p cladding layer and the p contact layer is grown at a normal pressure.

2. A method for producing a Group III nitride semiconductor light-emitting device according to claim 1, wherein the p cladding layer comprises AlGaN.

3. A method for producing a Group III nitride semiconductor light-emitting device according to claim 1, wherein said forming the p contact layer comprises forming the p contact layer on an entirety of an upper surface of the p cladding layer.

4. A method for producing a Group III nitride semiconductor light-emitting device according to claim 1, wherein said reversing the polarity comprises reversing a polarity of a crystal growth surface from Ga polarity to N polarity.

5. A method for producing a Group III nitride semiconductor light-emitting device according to claim 1, wherein said reversing the polarity comprises reversing a polarity of a crystal growth surface from Ga polarity to N polarity when the p cladding layer is formed at the pressure of 5 kPa to 70 kPa, and the Mg concentration is in the range of $1.8\times10^{20}/cm^3$ to $10\times10^{20}/cm^3$.

6. A method for producing a Group III nitride semiconductor light-emitting device according to claim 1, wherein the hexagonal columnar concave and convex configuration is formed on a surface of the p contact layer.

7. A method for producing a Group III nitride semiconductor light-emitting device according to claim 1, wherein the p contact layer is uniformly formed along the hexagonal columnar concave and convex configuration on the p cladding layer.

8. A method for producing a Group III nitride semiconductor light-emitting device according to claim 1, further comprising:
   forming an n contact layer on a sapphire substrate;
   disposing a GaN layer on a surface of the n contact layer;
   disposing an n cladding layer on a surface of the GaN layer; and
   disposing a light-emitting layer on a surface of the n cladding layer,
   wherein the p cladding layer is disposed on a surface of the light-emitting layer.

9. A method for producing a Group III nitride semiconductor light-emitting device according to claim 8, further comprising:
   forming a trench with a depth extending from a top surface of the p contact layer to the surface of the n contact layer in a portion of the top surface of the p contact layer; and
   forming an n-electrode on the surface of the n-contact layer exposed at a bottom of the trench.

10. A method for producing a Group III nitride semiconductor light-emitting device according to claim 1, wherein the amount of Mg doping in the p cladding layer is in a range from $1.8 \times 10^{20}/cm^3$ to $5 \times 10^{20}/cm^3$.

11. A method for producing a Group III nitride semiconductor light-emitting device according to claim 10, wherein the p cladding layer comprises AlGaN.

12. A method for producing a Group III nitride semiconductor light-emitting device according to claim 10, wherein the amount of Mg doping in the p cladding layer is in a range from $1.8 \times 10^{20}/cm^3$ to $2.4 \times 10^{20}/cm^3$.

13. A method for producing a Group III nitride semiconductor light-emitting device according to claim 12, wherein the p cladding layer comprises AlGaN.

* * * * *